United States Patent [19]
Patti

[11] Patent Number: 5,998,855
[45] Date of Patent: Dec. 7, 1999

[54] BIPOLAR POWER TRANSISTOR WITH BURIED BASE AND INTERDIGITATED GEOMETRY

[75] Inventor: Davide Patti, Catania, Italy

[73] Assignee: SGS-Thomson Microelectronics S.r.l.

[21] Appl. No.: 08/951,686

[22] Filed: Oct. 16, 1997

[30] Foreign Application Priority Data

Oct. 18, 1996 [EP] European Pat. Off. .............. 96830536

[51] Int. Cl.[6] ....................... H01L 27/082; H01L 27/102; H01L 29/00; H01L 31/11
[52] U.S. Cl. .......................... 257/578; 257/579; 257/580; 257/582
[58] Field of Search ................................... 257/578, 579, 257/580, 582

[56] References Cited

U.S. PATENT DOCUMENTS

| | | | |
|---|---|---|---|
| 3,740,621 | 6/1973 | Carley | 317/235 R |
| 5,408,124 | 4/1995 | Palara | 257/580 |
| 5,557,139 | 9/1996 | Palara | 257/592 |

FOREIGN PATENT DOCUMENTS

| | | | |
|---|---|---|---|
| 0 322 040 A2 | 6/1989 | European Pat. Off. | ........ H01L 21/82 |
| 0 544 364 A2 | 6/1993 | European Pat. Off. | ........ H01L 29/73 |
| 0 632 505 A1 | 1/1995 | European Pat. Off. | ........ H01L 29/73 |
| 410125692 | 5/1998 | Japan . | |

*Primary Examiner*—William Mintel
*Attorney, Agent, or Firm*—Allen, Dyer, Doppelt, Milbrath & Gilchrist, P.A.

[57] ABSTRACT

A bipolar power transistor of interdigitated geometry having a buried P type base region, a buried N type emitter region, a P type base-contact region, an N type emitter-contact region, connected to an emitter electrode and an N type connection region disposed around the emitter-contact region. The emitter region is buried within the base region in such a way that the buried emitter region and the connection region delimit a P type screen region. The transistor further includes a biasing P type region in contact with the emitter electrode, which extends up to the screen region.

12 Claims, 4 Drawing Sheets

BIPOLAR POWER TRANSISTOR WITH BURIED BASE AND INTERDIGITATED GEOMETRY

FIELD OF THE INVENTION

The present invention relates to a bipolar power transistor, and, more particularly, to a bipolar transistor with a buried base and interdigitated geometry.

SUMMARY OF THE INVENTION

A bipolar power transistor having a buried base and an interdigitated geometry is described in European patent application EP-A-0544364, and is illustrated in the partially sectioned schematic view of FIG. 1. As usual, the concentrations of impurities of N and P type are indicated by adding the + or − sign to the letters N and P to indicate, respectively, a high or low concentration of impurities. The letters N and P without the additional + or − sign denote concentrations of intermediate values. Such a bipolar transistor is made from a chip 100 of semiconductor material comprising a substrate 105 of N+ type, on which there are two epitaxial layers, 110 and 115, of N− type.

Between the first and second epitaxial layers 110 and 115, there is a buried base region 120 of P type, and a buried emitter region 125 of N+ type, which form between them a buried P-N junction. A deep P+ base-contact region 130 and a deep N+ emitter-contact region 135 extend from the upper surface of the chip 100 to the buried base region 120 and the buried emitter region 125, respectively. A surface emitter-contact region 140 of N+ type extends from the upper surface of the chip 100 around the region 135. The emitter-contact region provided by the regions 135 and 140 define a ballast resistor, the purpose of which is that of uniformly distributing the current around the entire perimeter of the emitter region. On the upper surface of the chip 100 which is covered with an insulating layer 145, there are metal lines or tracks 150 and 155 in contact with surface zones of the regions 130 and 140 respectively, which form the base and emitter electrodes respectively of the bipolar power transistor.

On the bottom of the chip 100, there is a metal layer 160 in contact with the substrate 105, which forms the collector electrode of the transistor. The bipolar power transistor has in plan view a so-called interdigitated geometry in which the emitter electrode 155 is in the form of a comb, the elongate (finger) portions of which lie within the base electrode 150. This structure has an emitter region with a very high perimeter-to-area ratio, and a uniform distribution of current in the various fingers of the emitter so that the bipolar power transistor can support high currents while having a small size. The bipolar power transistor described above is made utilizing the VIPower fabrication process (VIPower is a TM of SGS-THOMSON MICROELECTRONICS S.r.l.) as further described in European patent application EP-A-0322040.

Such bipolar power transistors have the disadvantage in operation of a high working current since part of the current provided to the base terminal flows directly to the emitter terminal through the portion of the epitaxial layer between the regions 130 and 140, and does not, therefore, contribute to the current gain of the transistor. Moreover, the emitter current does not only flow from the buried region 125 to the metal line or track 155 through the contact regions 135 and 140. There are, in fact, parallel direct paths through the epitaxial layer from the buried emitter region 125 to the metal track 155, which partially short-circuit the ballast resistor, creating a non-uniform current distribution in the various fingers of the emitter. These phenomena reduce the current gain and the safe operation area, or SOA, of the bipolar transistor.

A known arrangement for reducing these disadvantages is described in European patent application EP-A-0632505, and is illustrated in the partially sectioned schematic view of FIG. 2 (the elements already shown in FIG. 1 are identified with the same reference designations). This figure illustrates a bipolar transistor made from a chip 200 of semiconductor material in which there is a connection region 210 of N+ type which extends from the upper surface of the chip to the buried emitter region 125 at the perimeter thereof. A screen region 220 of P− type, delimited laterally from the connection region 210 and interposed between a major part of the emitter-contact regions 135, 140 and the buried emitter region 125, extends from the upper surface of the chip 200.

A further metal line or track 230 connects the deep contact region 210 and the screen region 220 together to allow the correct biasing of this latter. The screen region 220, the connection region 210 and the metal track 230 extend, in plan, around the entire perimeter of each emitter finger. This structure avoids the current losses from the base terminal and the buried emitter regions described above. This translates into a greater current gain, and a greater robustness of the bipolar transistor.

The known bipolar transistor described above, however, takes up more space on the semiconductor chip, because the biasing of the screen region requires an additional metal track. Moreover, it requires a dedicated layer for the formation of the screen region.

SUMMARY OF THE INVENTION

In view of the foregoing background, it is therefore an object of the present invention to provide a buried base bipolar power transistor being relatively compact and without a dedicated metal layer for the screen region.

This and other objects, features, and advantages in accordance with the present invention are provided by a bipolar power transistor of interdigitated geometry formed in a chip of semiconductor material of a first conductivity type. The bipolar transistor preferably comprises a buried base region of a second conductivity type and a buried emitter region of the first conductivity type buried in the semiconductor material and forming a buried junction. The buried emitter region is preferably buried within the buried base region. The transistor also includes a base-contact region of the second conductivity type extending from the surface of the chip to the buried base region, and an emitter-contact region of the first conductivity type extending from the surface of the chip to the buried emitter region and defining a ballast resistor. A conductor is preferably provided on the surface of the chip and is in contact with the emitter-contact region for providing an emitter electrode. A screen region of the second conductivity type is preferably disposed around the emitter-contact region. A connection region of the first conductivity type preferably extends from the surface to the buried emitter region around the screen region. In addition, the buried emitter region and the connection region may delimit a portion of the buried base region defining the screen region. The bipolar transistor also preferably includes at least one biasing region of the second conductivity type in contact on the surface with the emitter electrode and extending to the screen region.

The emitter-contact region preferably comprises a deep contact region extending from the surface to the buried emitter region and a surface contact region extending from the surface towards the buried emitter region around the deep emitter-contact region. Accordingly, the at least one biasing region may be formed so as to not completely surround the deep emitter-contact region.

The bipolar transistor of the present invention makes it possible to reduce the current losses and to achieve a good balancing of the emitter current between the elementary portions of the structure without, however, penalizing the electrical characteristics, or increasing the dimensions on the chip. The bipolar transistor of the present invention, has, in fact, a smaller size than that of the prior art described, in that the biasing of the screen region utilises the metal track which constitutes the emitter electrode.

The structure in accordance with the present invention does not require a dedicated layer for the formation of the screen region; the structure can therefore be produced with a standard fabrication process in that all the layers of semi-conductor material utilised for its production are already present in the basic sequence for the production of the bipolar power transistor.

BRIEF DESCRIPTION OF THE DRAWINGS

Further characteristics and advantages of the bipolar power transistor according to the present invention will become apparent from the following description of a preferred embodiment, given purely by way of non-limitative example, with reference to the attached drawings, in which.

DETAILED DESCRIPTION OF THE PREFERRED EMBODIMENTS

Figure 1:
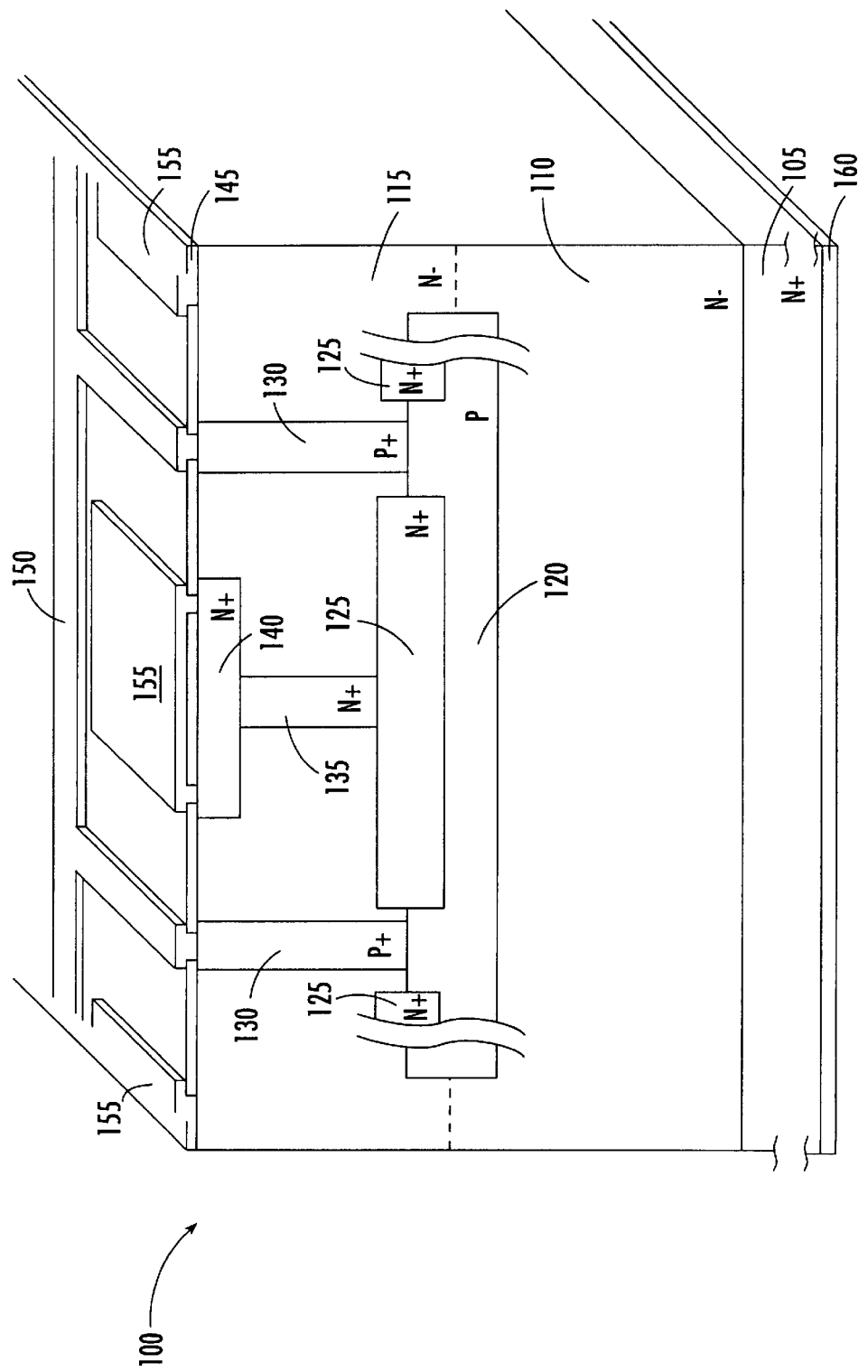
FIG. 1 is a schematic, partially sectioned view of a known buried-base bipolar power transistor having interdigated geometry as in the prior art.
Figure 2:
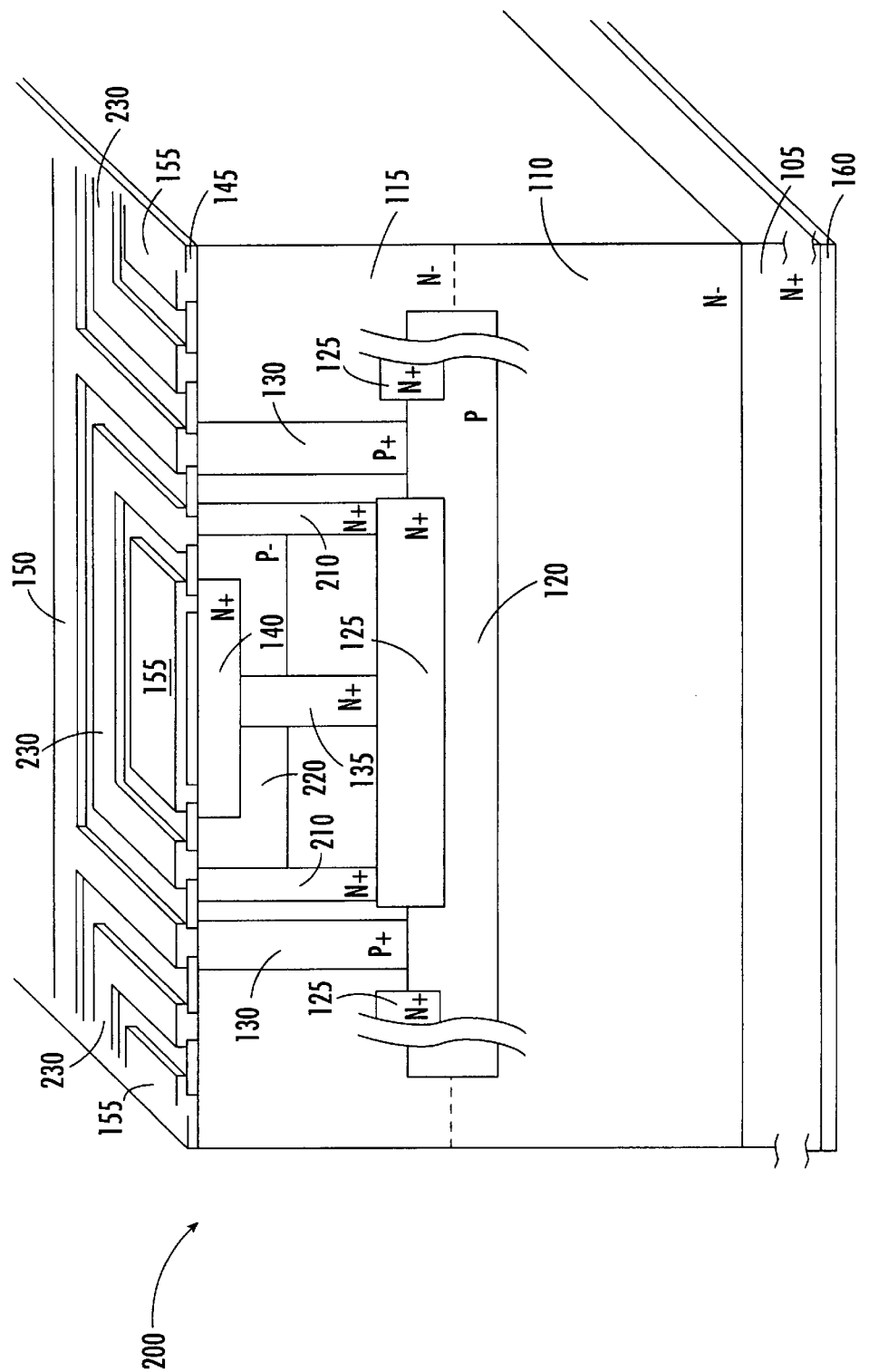
FIG. 2 is a partially sectioned schematic view of known bipolar power transistor with a screen region as in the prior art.
Figure 3:
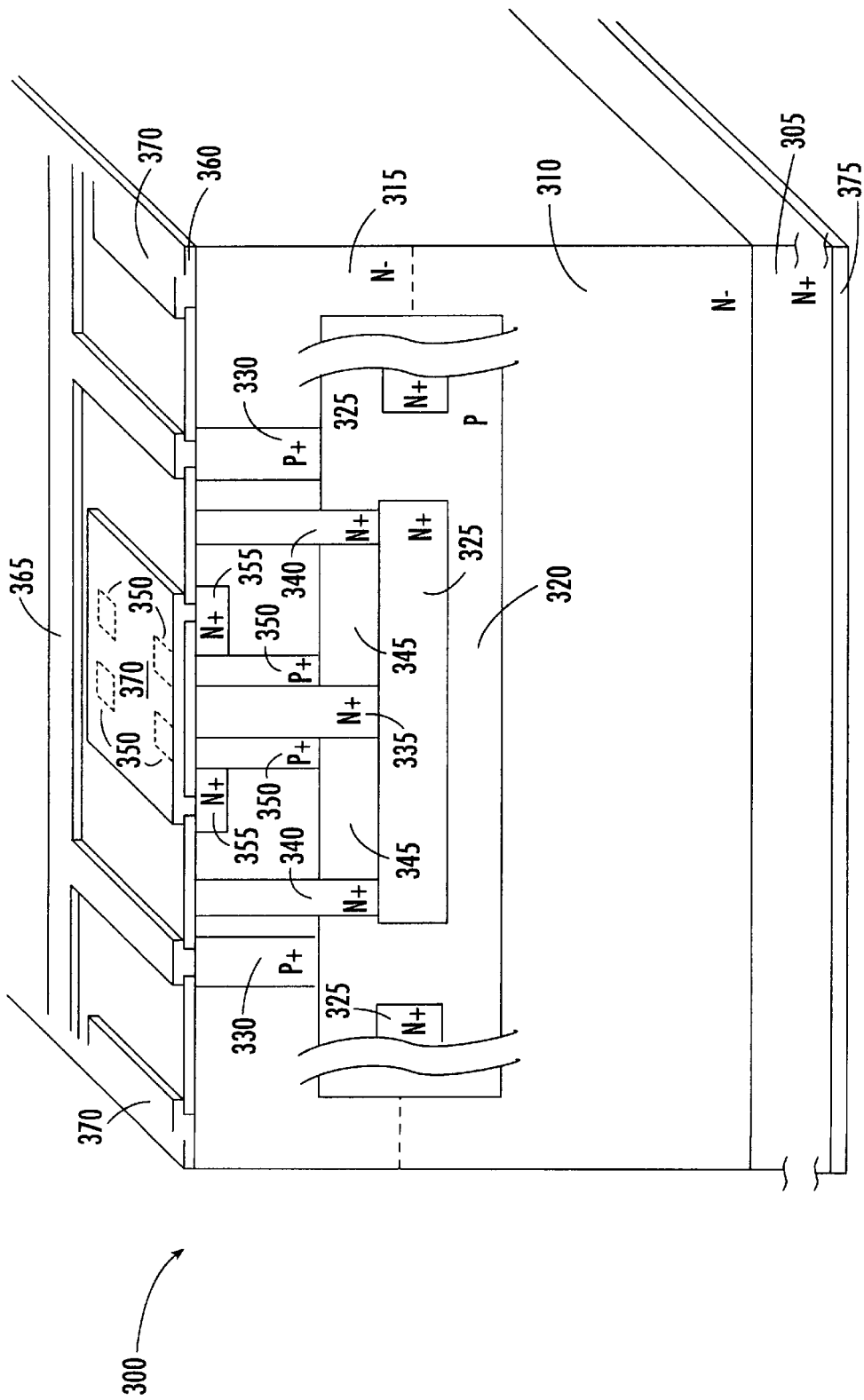
FIG. 3 is a partially sectioned schematic view of a bipolar power transistor according to the present invention.

With reference now to the drawings, and in particular with reference to FIG. 3 (FIGS. 1 and 2 have already been described above), a partially sectioned schematic view of a bipolar power transistor according to the present invention is illustrated. For simplicity of description reference will always be made hereinafter to a bipolar power transistor of NPN type made on a substrate and an epitaxial layer doped with impurities of N type. Equivalent considerations are applicable if the N type regions are replaced with corresponding P type regions and vice versa.

The bipolar power transistor is formed in a chip 300 of semi-conductor material comprising a substrate 305, typically mono-crystalline silicon strongly doped with impurities of N (N+) type. A first epitaxial layer 310 of the same conductivity type, but low concentration of (N–) impurities, is formed by epitaxial growth on the substrate 305.

On the upper surface of the epitaxial layer 310, there is formed by ion implantation and subsequent diffusion, a P type region having a concentration of impurities of intermediate value (P). A doped region of N+ type is then formed on this P type region by a subsequent implantation and diffusion phase. A second epitaxial layer 315 of N type having an impurity concentration greater than or equal to that of the first layer 310, is formed thereon by epitaxial growth.

In this phase, which takes place at high temperature, the previously implanted P type and N type impurities diffuse further into the two epitaxial layers 310 and 315, giving rise to buried regions. In particular, the P type impurities define a buried base region 320 of the bipolar power transistor, while the N type impurities define a buried emitter region 325 of the same bipolar transistor. The concentration and type of the P type and N type impurities in the buried base region 320 and emitter region 325 are chosen in such a way that, as a result of the different speed of diffusion of the different doping elements of P and N type, the region 325 is buried within the region 320. For example, utilizing low diffusivity N type impurities, (such as antimony or arsenic), the concentration of P type impurity (for example boron) is greater than $10^{13}$ atoms/cm$^2$ (the concentration of the N type impurities is not affected in this case).

In the second epitaxial layer 315, there are then formed, using known techniques of masking and ion implantation with subsequent diffusion, regions having high concentration of impurities, which substantially traverse the whole of the second epitaxial layer 315. In particular, a region 330 of P+ type joins with the buried base region 320 to define a deep base-contact, while a region 335 of N+ type joins up with the buried emitter region 325 to define a deep emitter-contact. A connection region 340 of N+ type extends to the buried emitter region 325 along the perimeter thereof. The connection region 340 and the buried emitter region 325 delimit a portion 345 of the buried base region 320. The portion 345 defines a screen region which is interposed between part of the emitter-contact region (described hereinafter), and the buried emitter region 325.

The connection region 340 and the screen region 345 extend, in plan, along the entire perimeter of each emitter finger. With similar ion implantation and diffusion techniques there are then formed one or more biasing regions 350 of P+ type, which extend through the epitaxial layer 315 to contact the screen region 345. Preferably these regions are adjacent to the deep emitter-contact region 335. Around the deep emitter-contact region 335 there is then formed the surface emitter-contact region 355 of N+ type, which has in plan an enlarged structure with respect to that of the region 335. The emitter-contact region provided by the regions 335 and 355 define a ballast resistor for the emitter of the bipolar transistor. As shown in the drawing, the biasing regions 350 are formed in such a way as not completely to surround the deep emitter-contact region 335, so as not to interrupt the ballast resistor. Preferably, the biasing regions 350 are provided by stud portions distributed in a uniform manner around the deep emitter-contact region 335.

Subsequently, on the front of the chip 300, which is covered with an insulating layer 360 (typically silicon dioxide), using known techniques for deposition, masking and etching, there are formed conductive lines or tracks, for example metal or polycrystalline silicon, 365 and 370 in contact with surface zones of the regions 330 and 335, 355 respectively, which respectively form the base and emitter electrodes of the bipolar power transistor. The metal track 370 is moreover also in contact with the surface zones of the regions 350 to allow correct biasing of the screen region 345. The bipolar power transistor has in plan a so-called interdigitated geometry, in which the emitter electrode 370 extends in the form of a comb with the elongate (finger) portions within the base electrode 365. On the bottom of the chip 300, there is a metal layer 375 in contact with the substrate 305 which forms the collector electrode of the bipolar power transistor.

Figure 4:
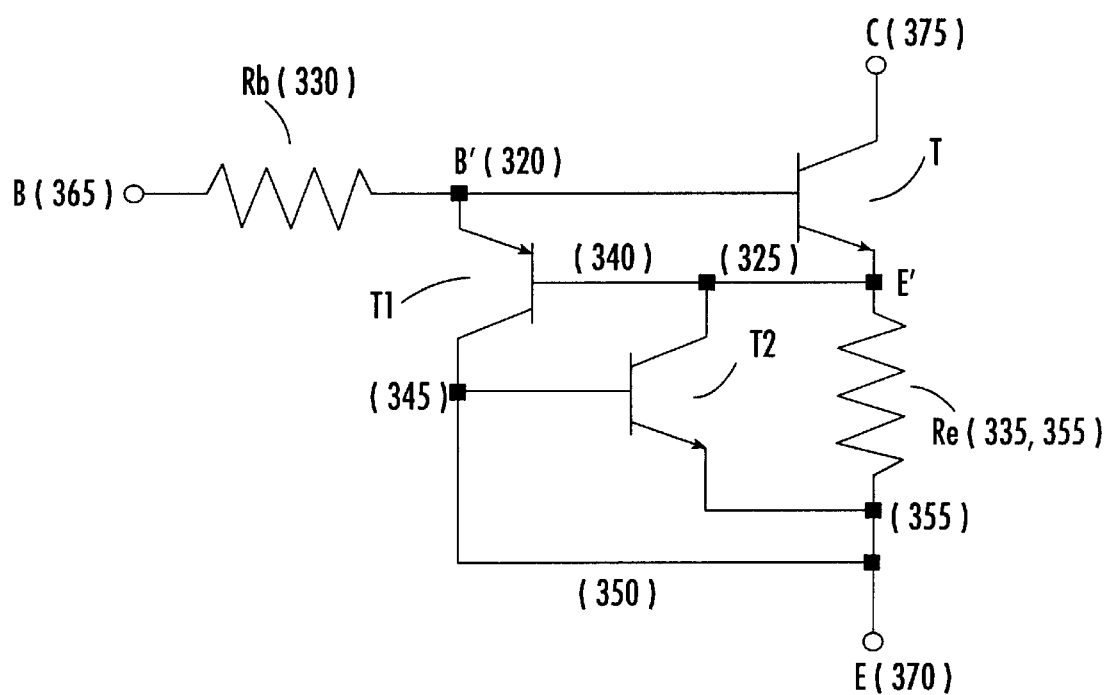
FIG. 4 is an equivalent circuit diagram of the bipolar transistor of FIG. 3.

The equivalent circuit diagram of the bipolar transistor described above is shown in FIG. 4. The circuit illustrated comprises an NPN bipolar power transistor T, having an emitter terminal E (connected to the track 370), a base terminal B (connected to the track 365), and a collector terminal C (connected to the layer 375). The bipolar transistor T further has an internal base terminal B' (buried base region 320), and an internal emitter terminal E' (buried emitter region 325). Between the terminals B–B' and between the terminals E–E', there are, respectively, a base resistor Rb and an emitter resistor Re which represent the internal resistances respectively of the base-contact region 330 and the emitter-contact region 335, 355. The circuit then includes a lateral PNP bipolar transistor T1 created by the P type region 320 (emitter in the conduction phase of the transistor T), the N type region 340 (base) and the P type region 345 (collector), and a vertical bipolar NPN transistor T2 created by the N type region 355 (emitter in the conduction phase of the transistor T), the P type region 345 (base) and the N type region 325 (collector).

As illustrated in the drawing, the emitter, base and collector terminals of the transistor T1 are connected, respectively, to the internal base terminal B' (common region 320), the internal emitter terminal E' (contact region 340 with region 325), and base terminal of the transistor T2 (common region 345). The emitter and collector terminals of the transistor T2 are respectively connected to the terminal E (contact track 370 with region 355), and internal emitter terminal E' (common region 325). The collector terminal of the transistor T1 and the base terminal of the transistor T2 are, moreover, connected to the terminal E by the biasing region 350.

Analyzing the equivalent circuit illustrated in the drawing shows that the transistor T2, with the base and emitter terminals short-circuited, is always switched off. The two transistors T and T1 have the same base-emitter voltage, but of opposite sign. Because their base-emitter threshold voltage is substantially the same, the transistor T1 will always be in conduction when the power transistor T is in conduction. The transistor T1 subtracts part of the current provided to the base terminal B, which does not therefore contribute to the current gain of the power transistor T. With reference to FIG. 3, note however that the transistor T1 has a low current, because of the high resistance of the collector region 345. Advantageously, the biasing regions 350 are disposed alongside the deep emitter-contact regions 335, in such a way that the collector region of the transistor T1 has a greater length, and therefore a greater resistivity. In a preferred embodiment of the present invention, the N+ type region 340, i.e. the base region of the transistor T1 is doped with a very high concentration of N type impurities. This further reduces the gain of the transistor T1, and therefore the magnitude of the current subtracted thereby from the power transistor T.

The structure in accordance with the present invention therefore has very little base current loss which, above all, is substantially constant with an increase in working current so that its percentage effect diminishes with an increase in the working current. From experimental results it has been established that the bipolar transistor in accordance with the present invention has a current gain variation, as a function of the working current, which is better than that presented by known structures for high currents. Moreover, this structure makes it possible to obtain a uniform distribution of the current in the various emitter fingers so that current concentrations in limited regions are not recorded. This allows a greater robustness to be obtained even for high values of working current.

That which is claimed is:

1. A bipolar power transistor of interdigitated geometry formed in a chip of semiconductor material of a first conductivity type, comprising:

a buried base region of a second conductivity type and a buried emitter region of the first conductivity type buried in the semiconductor material and forming a buried junction, the buried emitter region being buried within the buried base region;

a base-contact region of the second conductivity type extending from the surface of the chip to the buried base region;

an emitter-contact region of the first conductivity type extending from the surface of the chip to the buried emitter region and defining a ballast resistor;

a conductor on the surface of the chip and being in contact with the emitter-contact region for providing an emitter electrode;

a screen region of the second conductivity type disposed around the emitter-contact region;

a connection region of the first conductivity type extending from the surface to the buried emitter region around the screen region;

the buried emitter region and the connection region delimiting a portion of the buried base region defining the screen region; and at least one biasing region of the second conductivity type in contact on the surface with the emitter electrode and extending to the screen region.

2. A bipolar transistor according to claim 1, wherein the emitter-contact region comprises a deep contact region extending from the surface to the buried emitter region and a surface contact region extending from the surface towards the buried emitter region around the deep emitter-contact region; and wherein the at least one biasing region is formed so as to not completely surround the deep emitter-contact region.

3. A bipolar transistor according to claim 2, wherein the at least one biasing region lies adjacent to a portion of the deep emitter-contact region.

4. A bipolar transistor according to claim 2, comprising a plurality of non-adjacent biasing regions distributed in a uniform manner around the deep emitter-contact region.

5. A bipolar transistor according to claim 1, wherein the connection region has a greater impurity concentration than that of the buried emitter region and the emitter-contact region.

6. A bipolar transistor according to claim 1, wherein the first conductivity type is N and the second conductivity type is P.

7. A bipolar power transistor comprising:

a chip of semiconductor material of a first conductivity type;

a buried base region of a second conductivity type and a buried emitter region of the first conductivity type buried in the chip of semiconductor material and forming a buried junction, the buried emitter region being buried within the buried base region;

a base-contact region of the second conductivity type extending from the surface of the chip to the buried base region;

an emitter-contact region of the first conductivity type extending from the surface of the chip to the buried emitter region and defining a ballast resistor;

a conductor on the surface of the chip and being in contact with the emitter-contact region for providing an emitter electrode;

a connection region of the first conductivity type extending from the surface to the buried emitter region around the screen region;

the buried emitter region and the connection region delimiting a portion of the buried base region and defining a screen region of the second conductivity type disposed around the emitter-contact region; and at least one biasing region of the second conductivity type in contact on the surface with the emitter electrode and extending to the screen region.

8. A bipolar transistor according to claim 7, wherein the emitter-contact region comprises a deep contact region extending from the surface to the buried emitter region and a surface contact region extending from the surface towards the buried emitter region around the deep emitter-contact region; and wherein the at least one biasing region is formed so as to not completely surround the deep emitter-contact region.

9. A bipolar transistor according to claim 8, wherein the at least one biasing region lies adjacent to a portion of the deep emitter-contact region.

10. A bipolar transistor according to claim 8, comprising a plurality of non-adjacent biasing regions distributed in a uniform manner around the deep emitter-contact region.

11. A bipolar transistor according to claim 7, wherein the connection region has a greater impurity concentration than that of the buried emitter region and the emitter-contact region.

12. A bipolar transistor according to claim 7, wherein the first conductivity type is N and the second conductivity type is P.

\* \* \* \* \*